(12) United States Patent
Sawa et al.

(10) Patent No.: US 9,312,271 B2
(45) Date of Patent: Apr. 12, 2016

(54) NON-VOLATILE MEMORY DEVICE AND METHOD FOR MANUFACTURING SAME

(71) Applicant: KABUSHIKI KAISHA TOSHIBA, Tokyo (JP)

(72) Inventors: Keiichi Sawa, Mie (JP); Masayuki Tanaka, Mie (JP); Katsuaki Natori, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/597,259

(22) Filed: Jan. 15, 2015

(65) Prior Publication Data

US 2016/0035740 A1 Feb. 4, 2016

Related U.S. Application Data

(60) Provisional application No. 62/031,914, filed on Aug. 1, 2014.

(51) Int. Cl.
*H01L 27/108* (2006.01)
*H01L 29/76* (2006.01)
(Continued)

(52) U.S. Cl.
CPC .... *H01L 27/11582* (2013.01); *H01L 21/02192* (2013.01); *H01L 21/28282* (2013.01); *H01L 27/11565* (2013.01); *H01L 29/4234* (2013.01); *H01L 29/511* (2013.01); *H01L 29/517* (2013.01)

(58) Field of Classification Search
CPC ............. H01L 21/28294; H01L 21/8229; H01L 21/28158; H01L 21/3226; H01L 21/3141; H01L 21/31683; H01L 21/02326; H01L 21/0228; H01L 21/02642; H01L 21/048; H01L 27/11514; H01L 28/57; H01L 29/7869; H01L 51/102; C23C 16/456; C23C 16/277
USPC ........... 257/89, 296, 298, 308, 315, 316, 321, 257/649, 760, 791, E21.006, E21.007, 257/E21.045, E21.061, E21.077, E21.126, 257/E21.127, E21.17, E21.267, E21.645
See application file for complete search history.

(56) References Cited

U.S. PATENT DOCUMENTS 7,982,260 B2 * 7/2011 Fukuzumi ........... H01L 21/8221
257/324
8,309,405 B2 * 11/2012 Yang ................. H01L 27/11582
438/156

(Continued)

OTHER PUBLICATIONS

Jaehoon Jang et al., "Vertical Cell Array using TCAT (Terabit Cell Array Transistor) Technology for Ultra High Sensity NAND Flash Memory", 2009 *Symposium on VLSI Technology Digest of Technical Papers*, pp. 192-193.

*Primary Examiner* — David Nhu
(74) *Attorney, Agent, or Firm* — Finnegan, Henderson, Farabow, Garrett & Dunner, LLP (57) ABSTRACT

According to an embodiment, a non-volatile memory device includes electrodes, an inter-layer insulating film between the electrodes and at least one semiconductor layer extending through the electrodes and the inter-layer insulating film. The device includes a charge storage layer between the semiconductor layer and each electrode, a first insulating film between the charge storage layer and the semiconductor layer, and a second insulating film. The second insulating film includes a first portion between the charge storage layer and each electrode, a second portion between each electrode and the inter-layer insulating film, and a third portion that links the first portion and the second portion. In a cross-section of the third portion parallel to the first direction and a second direction toward each electrode from the charge storage layer, a curved surface on the charge storage layer side has a curvature radius larger than a surface on the electrodes side.

12 Claims, 7 Drawing Sheets

(51) Int. Cl.
  *H01L 29/94*      (2006.01)
  *H01L 31/119*     (2006.01)
  *H01L 27/115*     (2006.01)
  *H01L 21/28*      (2006.01)
  *H01L 21/02*      (2006.01)
  *H01L 29/51*      (2006.01)
  *H01L 29/423*     (2006.01)

(56) References Cited

U.S. PATENT DOCUMENTS

| | | | |
|---|---|---|---|
| 8,338,876 B2 * | 12/2012 | Kito | H01L 27/11551 257/315 |
| 8,507,972 B2 | 8/2013 | Oota et al. | |
| 8,581,330 B2 * | 11/2013 | Kiyotoshi | H01L 29/7926 257/324 |
| 8,598,643 B2 | 12/2013 | Kawasaki et al. | |
| 8,729,623 B2 * | 5/2014 | Ohsawa | H01L 21/28282 257/324 |
| 8,759,897 B2 | 6/2014 | Oota et al. | |
| 9,166,032 B1 * | 10/2015 | Higuchi | H01L 21/0262 |
| 2010/0327340 A1 | 12/2010 | Oota et al. | |
| 2011/0303969 A1 | 12/2011 | Kai et al. | |
| 2013/0075742 A1 | 3/2013 | Ohsawa et al. | |
| 2013/0228853 A1 | 9/2013 | Higuchi et al. | |
| 2013/0292758 A1 | 11/2013 | Oota et al. | |

* cited by examiner

FIG. 7B

NON-VOLATILE MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/031,914 filed on Aug. 1, 2014; the entire contents of which are incorporated herein by reference.

FIELD

Embodiments are generally related to a non-volatile memory device and a method for manufacturing the same.

BACKGROUND

Development of a memory cell array having a three-dimensional structure is being advanced to realize a next-generation non-volatile memory device. The memory cell array having the three-dimensional structure includes multiple word lines that are stacked and memory cells that are formed in the interiors of memory holes extending through the multiple word lines. In such a non-volatile memory device, it is desirable to improve the characteristics of the memory cells.

BRIEF DESCRIPTION OF THE DRAWINGS

FIGS. 3A to 3F are exemplary cross-sectional views schematically showing a manufacturing method of the non-volatile memory device according to the first embodiment;

FIGS. 4A to 4D are exemplary cross-sectional views schematically showing a manufacturing method of the non-volatile memory device according to a variation of the first embodiment;

FIGS. 6A to 6D are exemplary cross-sectional views schematically showing a manufacturing method of the non-volatile memory device according to the second embodiment.

DETAILED DESCRIPTION

According to an embodiment, a non-volatile memory device includes electrodes arranged in a first direction, an inter-layer insulating film between the electrodes, and at least one semiconductor layer extending in the first direction through the electrodes and the inter-layer insulating film. The device further includes a charge storage layer between the semiconductor layer and each of the electrodes, a first insulating film between the charge storage layer and the semiconductor layer, and a second insulating film. The second insulating film includes a first portion, a second portion, and a third portion, wherein the first portion is provided between the charge storage layer and each of the electrodes; the second portion is provided between each of the electrodes and the inter-layer insulating film; and the third portion links the first portion and the second portion, and has a curved surface on the charge storage layer side. In a cross-section of the third portion parallel to the first direction and a second direction toward each of the electrodes from the charge storage layer, the curved surface on the charge storage layer side has a curvature radius larger than a curvature radius of a surface on the electrodes side.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
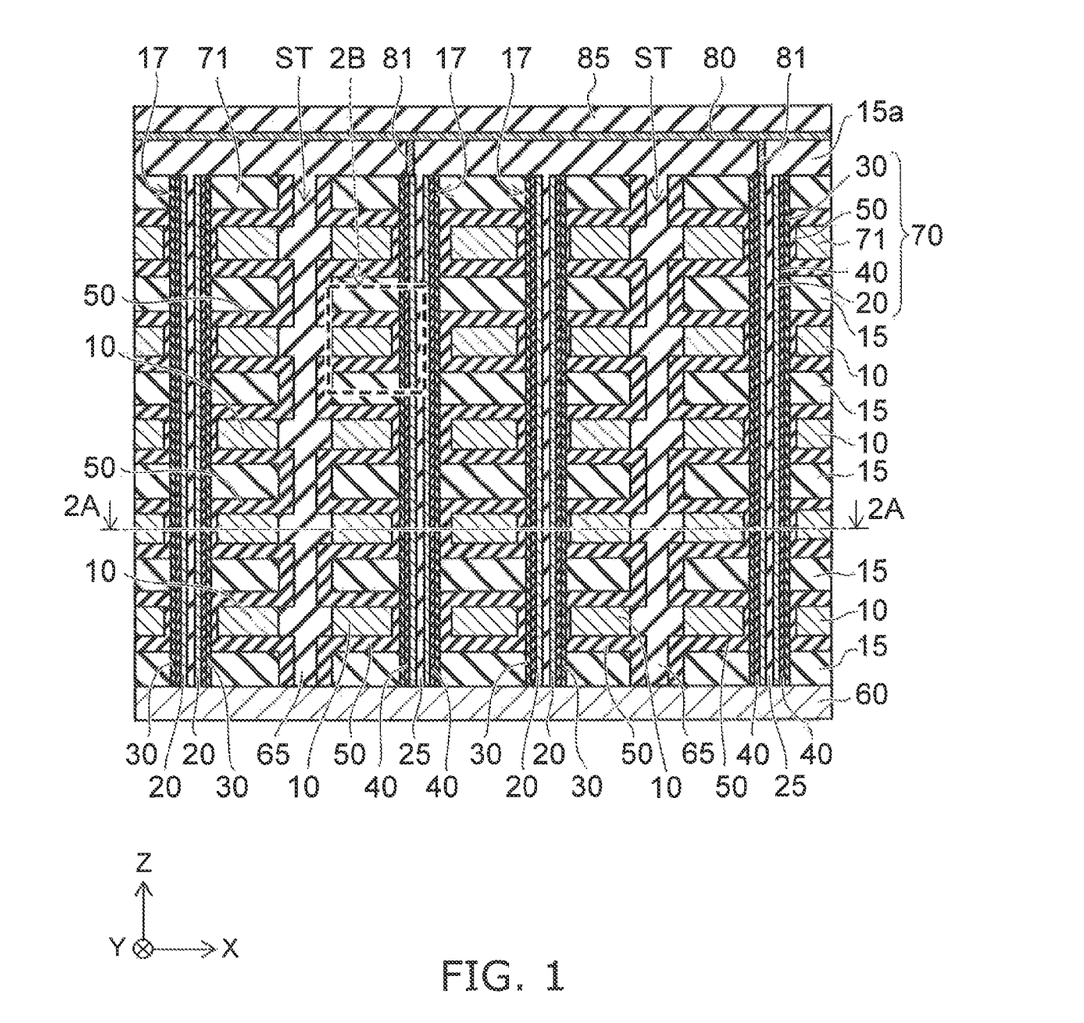
FIG. 1 is an exemplary cross-sectional view schematically showing a non-volatile memory device according to a first embodiment.

FIG. 1 is a schematic cross-sectional view showing a non-volatile memory device 1 according to a first embodiment.

The non-volatile memory device 1 shown in FIG. 1 is one example; and the embodiment is not limited thereto.

The non-volatile memory device 1 includes, for example, multiple electrodes (hereinbelow, control gates 10) arranged in a first direction (hereinbelow, the Z-direction) perpendicular to a substrate, and at least one semiconductor layer (hereinbelow, a channel body 20). The channel body 20 extends in the Z-direction through the multiple control gates 10.

For example, the control gates 10 are disposed to be arranged in the Z-direction with an inter-layer insulating film 15 interposed. The control gates 10 and the inter-layer insulating film 15 are disposed alternately in the Z-direction. For example, the channel body 20 is provided in a memory hole 17 that extends through the control gates 10 and the inter-layer insulating film 15 in the Z-direction.

The control gates 10 are disposed to be arranged in the X-direction with a slit ST interposed. The interior of the slit ST is filled with an insulating film 65. The insulating film 65 electrically insulates the control gates 10 disposed to be arranged in the X-direction.

The non-volatile memory device 1 includes a charge storage layer 30, a first insulating film 40, and a second insulating film 50 between the channel body 20 and each of the multiple control gates 10. The charge storage layer 30 is provided between the first insulating film 40 and each of the control gates 10. For example, the charge storage layer 30 extends in the Z-direction along the channel body 20.

The first insulating film 40 extends in the Z-direction along the channel body 20 between the channel body 20 and the charge storage layer 30. For example, the first insulating film 40 contacts the charge storage layer 30. The second insulating film 50 is provided between the charge storage layer 30 and each of the control gates 10.

Figure 2A:
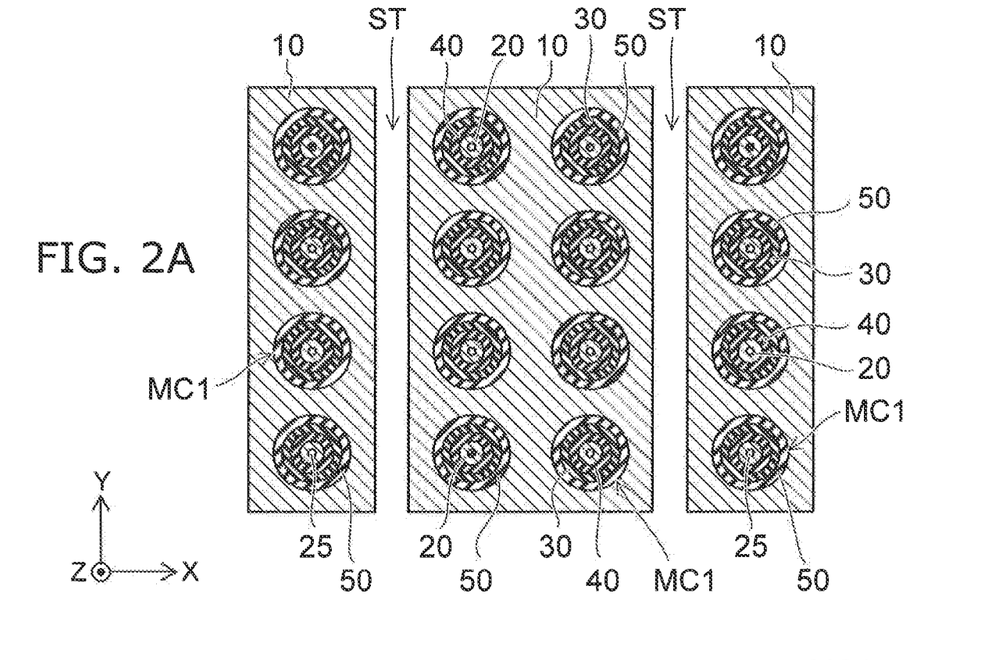
FIGS. 2A and 2B are another exemplary cross-sectional view schematically showing the non-volatile memory device according to the first embodiment.

The non-volatile memory device 1 will now be described in detail with reference to FIG. 1 to FIG. 2B. FIG. 2A is a cross-sectional view along line 2A-2A shown in FIG. 1, FIG.

2B is an enlarged partial cross-sectional view of region 2B shown in FIG. 1 and shows the structure of a memory cell MC1.

As shown in FIG. 1, the multiple control gates 10 are provided on a source interconnect 60. For example, the source interconnect 60 is provided on a substrate (not-shown) with an inter-layer insulating film interposed. A memory hole 17 communicates with the source interconnect 60. The channel body 20 extends in the Z-direction along the inner wall of the memory hole 17. The channel body 20 is electrically connected to the source interconnect 60 at the bottom surface of the memory hole 17.

A selection transistor 70 is provided on the uppermost layer in the Z-direction of the multiple control gates 10. The selection transistor 70 includes the channel body 20, the charge storage layer 30, the first insulating film 40, the second insulating film 50, and a selection gate 71. The charge storage layer 30, the first insulating film 40, and the second insulating film 50 act as the gate insulator film of the transistor.

Further, a bit line 80 is provided on the selection transistor 70. The bit line 80 is electrically connected to the channel body 20 via a contact plug 81. The bit line 80 and the contact plug 81 are formed inside an insulating film 85 provided on an inter-layer insulating film 15a. The inter-layer insulating film 15a is the uppermost layer of the multiple inter-layer insulating films 15 provided on the source interconnect 60.

The bit line 80 extends in, for example, the X-direction. Also, the bit line 80 is electrically connected to the multiple channel bodies 20 disposed to be arranged in the X-direction. The bit line 80 is electrically connected to one of the multiple channel bodies 20 that extend through each of the multiple control gates 10.

As shown in FIG. 2A, the control gates 10 extend in the Y-direction. The multiple control gates 10 are disposed to be arranged in the X-direction. The slit ST is provided between the mutually-adjacent control gates 10.

For example, the slit ST is a trench having a depth from the inter-layer insulating film 15a of the uppermost layer to the source interconnect 60 and extends in the Y-direction. Although the slit ST is made on a side of every two memory holes 17 in the X-direction in the example, the embodiment is not limited thereto. For example, the slit ST may be made on a side of each control gate 10 that includes any number of memory holes arranged in the X-direction. In other words, the control gates 10 are formed around multiple memory holes arranged in the X-direction and the Y-direction.

As shown in FIG. 2A, multiple memory cells MC1 are provided in one of control gates 10. Although the multiple memory cells MC1 are formed to be arranged in two columns in the Y-direction in the example, the embodiment is not limited thereto. For example, the multiple memory cells MC1 that are provided at one control gate 10 may be disposed in a matrix configuration in the X-Y plane or may be disposed in a staggered configuration.

The cross section of the memory cell MC1 perpendicular to the Z-direction is, for example, a circle. The memory cell MC1 includes the channel body 20, the first insulating film 40, the charge storage layer 30, and the second insulating film 50 in this order from the center. For example, a core 25 that is electrically insulative body is provided inside the channel body 20.

The first insulating film 40 acts as, for example, a tunneling insulating film. The charge storage layer 30 retains charge injected from the channel body 20. The second insulating film 50 acts as, for example, a blocking insulating film that impedes movement of carriers between the charge storage layer 30 and the control gates 10.

Figure 2B:
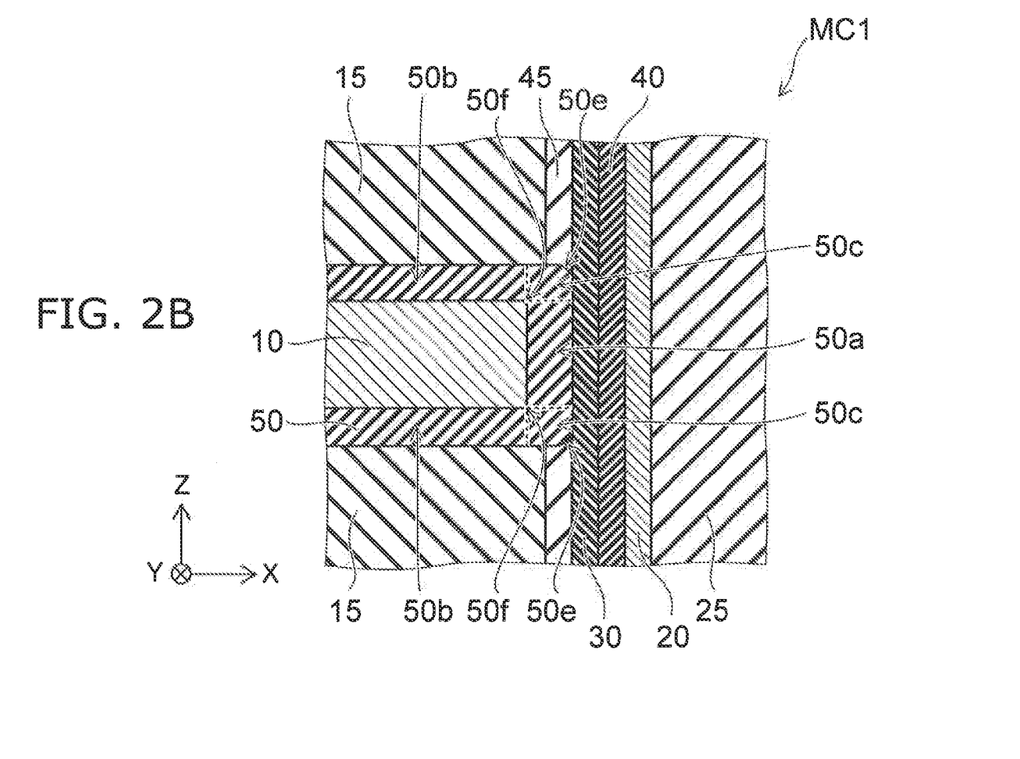

As shown in FIG. 2B, the memory cell MC1 is provided between the channel body 20 and the control gate 10. The second insulating film 50 includes a portion positioned between the control gate 10 and the charge storage layer 30 and a portion extending between the control gate 10 and the inter-layer insulating film 15.

In other words, the second insulating film 50 includes a first portion 50a, a second portion 50b, and a third portion 50c. The first portion 50a is provided between the control gate 10 and the charge storage layer 30. The second portion 50b is provided between the control gate 10 and the inter-layer insulating film 15 adjacent to the control gate 10. The third portion 50c links the first portion 50a and the second portion 50b.

Further, a third insulating film 45 is provided between the inter-layer insulating film 15 and the charge storage layer 30 between the memory cells MC1 adjacent to each other in the Z-direction. The third insulating film 45 extends in the Z-direction along the charge storage layer 30 and contacts the second insulating film 50.

The second insulating film 50 includes, for example, a material having a dielectric constant higher than those of the inter-layer insulating film 15 and the third insulating film 45. The second insulating film 50 includes, for example, a metal oxide. The second insulating film 50 may include a so-called High-k film.

The second insulating film 50 has a curved surface at the third portion 50c on the charge storage layer 30 side. Also, the surface of the third portion 50c has a convex surface protruded toward the charge storage layer 30 side. Also, an outer edge 50e of the third portion 50c has a curvature radius larger than that of an outer edge 50f on the control gate 10 side in a cross section parallel to the Z-direction and a direction (a second direction) from the charge storage layer 30 toward the control gate 10. Also, the curvature radius of the outer edge 50e is, for example, greater than the film thickness of the third insulating film 45.

For example, when the cross section of the second insulating film 50 perpendicular to the Z-direction is a circle as shown in FIG. 2A, the outer edge 50e of the third portion 50c has a curvature radius larger than that of the outer edge 50f on the control gate 10 side in a cross section that includes the center of the circle and is parallel to the Z-direction.

In other words, the outer edge is formed to be rounded at the two ends in the Z-direction of the portion (the first portion 50a) of the second insulating layer 50 contacting the charge storage layer 30. Therefore, the high dielectric portion becomes smaller than that of the case where the end portions are formed sharply. In other words, a portion of the third insulating film 45 is interposed between the third portion 50c and the charge storage layer 30. Thereby, the capacitance with the memory cell MC1 adjacent in the Z-direction can be reduced.

For example, in the programming operation, the voltage that is applied to the selected memory cell MC1 is applied also to an unselected memory cell via capacitive coupling with the adjacent memory cell. By reducing the capacitance with the adjacent memory cell MC1, the voltage is reduced; and misprogramming to the unselected memory cell can be suppressed.

Also, for multi-bit memory cells, the programming of the desired threshold is performed by repeatedly applying a programming voltage to the selected memory cell and reading the threshold. For such a memory cell, by reducing the capacitive coupling with the adjacent memory cell, it is possible to suppress the fluctuation of the threshold between the memory cells; and high performance of the memory cells can be expected.

Further, by increasing the curvature radius of the surface of the third portion 50c on the charge storage layer 30 side, the electric field concentration at the Z-direction ends of the second insulating film 50 can be relaxed. Thereby, dielectric breakdown of the second insulating film 50 is avoided; and it is possible to suppress the characteristic degradation of the memory cell MC1.

Also, by interposing the second insulating film 50 having the high dielectric constant between the control gate 10 and the inter-layer insulating film 15, the electric field to the adjacent memory cell is relaxed; and leakage current between the control gates 10 adjacent to each other in the Z-direction can be suppressed. In other words, the dielectric breakdown voltage between the control gates 10 can be increased. As a result, it is possible to reduce the film thickness of the inter-layer insulating film 15; and it is possible to increase the number of stacks of control gates 10. Thereby, the number of memory cells is increased; and higher integration of the memory cells can be realized.

A method for manufacturing the non-volatile memory device 1 according to the first embodiment will now be described with reference to FIGS. 3A to 3F. FIGS. 3A to 3F are schematic cross-sectional views showing manufacturing processes of the non-volatile memory device 1.

Figure 3A:
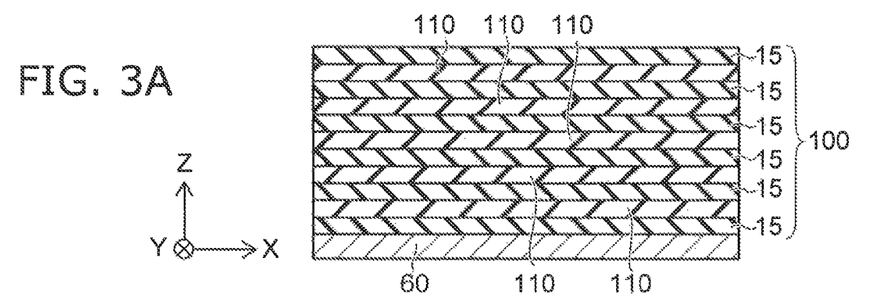

As shown in FIG. 3A, the inter-layer insulating films 15 and sacrificial films 110 are stacked alternately on the source interconnect 60 which is an underlying layer. Thereby, a stacked body 100 that includes the multiple inter-layer insulating films 15 and the multiple sacrificial films 110 is formed.

The inter-layer insulating films 15 are, for example, silicon oxide films. The sacrificial films 110 are, for example, silicon nitride films. The inter-layer insulating films 15 and the sacrificial films 110 each are formed to have, for example, a thickness of about 50 nanometers. The inter-layer insulating films 15 and the sacrificial films 110 can be formed using, for example, low pressure CVD (Chemical Vapor Deposition).

For example, the inter-layer insulating films 15 are formed at a deposition temperature of 600 to 800° C. in a reduced-pressure atmosphere of not more than 2000 Pa using TEOS (tetraethyl orthosilicate) as a source material. For example, the sacrificial films 110 are formed at a deposition temperature of 600 to 800° C. in a reduced-pressure atmosphere of not more than 2000 Pa using dichlorosilane ($SiH_2Cl_2$), and ammonia ($NH_3$) as source materials.

Figure 3B:
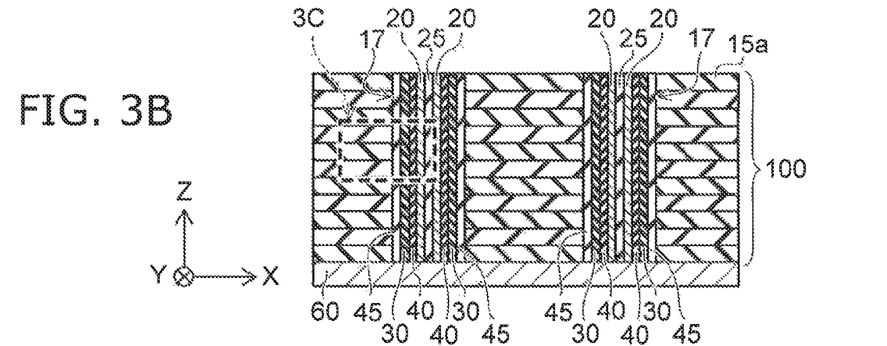

As shown in FIG. 3B, the memory holes 17 are made to extend through the stacked body 100 in the Z-direction. For example, polysilicon is used as a mask material; and a memory hole pattern is formed on the stacked body 100. Continuing, the memory holes 17 are made in the stacked structure of the silicon oxide films and the silicon nitride films using, for example, RIE (Reactive Ion Etching).

Subsequently, the channel body 20, the charge storage layer 30, the first insulating film 40, the third insulating film 45, and the core 25 are formed in the memory hole. For example, the third insulating film 45, the charge storage layer 30, and the first insulating film 40 are formed in this order on the inner wall of the memory hole 17. Then, the channel body 20 is formed on the first insulating film 40; and the core 25 is formed on the channel body 20.

The third insulating film 45 is, for example, a silicon oxide film having a thickness of about 5 nm. The third insulating film 45 is formed using, for example, ALD (Atomic Layer Deposition). For example, the third insulating film 45 is formed at a deposition temperature of 400 to 800° C. in a reduced-pressure atmosphere of not more than 2000 Pa. The source gas includes, for example, TDMAS (tetradimethyl aminosilane) and ozone ($O_3$).

The charge storage layer 30 is, for example, a silicon nitride film having a thickness of about 5 nm. For example, the charge storage layer 30 is formed using ALD at a deposition temperature of 300 to 700° C. in a reduced-pressure atmosphere of not more than 2000 Pa. The source gas includes, for example, dichlorosilane ($SiH_2Cl_2$) and ammonia ($NH_3$).

The first insulating film 40 is, for example, a silicon oxide film having a thickness of about 7 nm. For example, the first insulating film 40 is formed using ALD at a deposition temperature of 400 to 800° C. in a reduced-pressure atmosphere of not more than 2000 Pa. The source gas includes, for example, TDMAS and ozone ($O_3$).

The channel body 20 is, for example, amorphous silicon of about 10 nm. For example, the channel body 20 is formed using CVD at a deposition temperature of 400 to 800° C. in a reduced-pressure atmosphere of not more than 2000 Pa. The source gas includes, for example, silane ($SiH_4$).

The core 25 is, for example, a silicon oxide film of about 10 nm. For example, the core 25 is formed using CVD at a deposition temperature of 400 to 800° C. in a reduced-pressure atmosphere of not more than 2000 Pa. The source gas includes, for example, TDMAS and ozone ($O_3$).

Then, the sacrificial films 110 are selectively removed. Specifically, the slit ST is made to divide the stacked body 100 (referring to FIG. 1); and only the sacrificial films 110 are selectively removed via the slit ST. For example, the sacrificial films 110 can be selectively removed without etching the silicon oxide films by etching the silicon nitride films using hot phosphoric acid.

The processes of forming the control gates 10 and the second insulating films 50 will now be described with reference to FIGS. 3C to 3F. FIGS. 3C to 3F are partial cross-sectional views showing the enlarged region 3C shown in FIG. 3B.

Figure 3C:
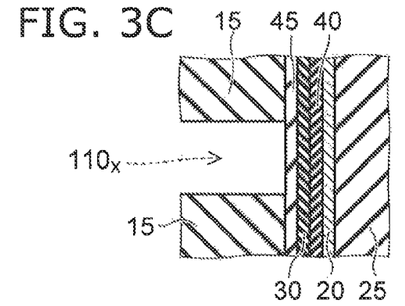

As shown in FIG. 3C, the inter-layer insulating film 15 and the third insulating film 45 are exposed in a space 110x where the sacrificial films 110 are removed. The inter-layer insulating film 15 and the third insulating film 45 are, for example, silicon oxide films.

Figure 3D:
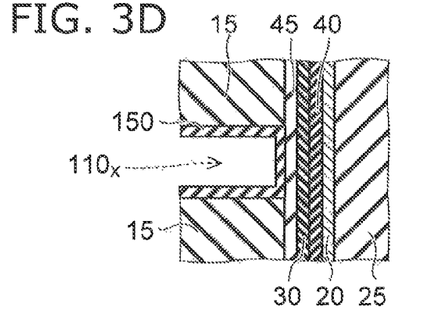

As shown in FIG. 3D, a metal oxide film 150 is deposited on the inter-layer insulating film 15 and the third insulating film 45 that are exposed in the space 110x. The metal oxide film 150 is, for example, LaAlOx having a thickness of about 7 nm. For example, the metal oxide film 150 is formed using ALD at a deposition temperature of 100 to 500° C. in a reduced-pressure atmosphere of not more than 2000 Pa. For example, $(C_3H_7C_5H_4)_3La$ is used as the La source material. For example, TMA (tetramethylaluminum) is used as the Al source material. For example, ozone ($O_3$) is used as an oxidizing agent.

Then, the metal oxide film 150 is modified by performing heat treatment. For example, the metal oxide film 150 and the third insulating film 45 can be caused to react by annealing at 950° C. inside a nitrogen ($N_2$) atmosphere. Also, the metal oxide film 150 and the inter-layer insulating films 15 are caused to react. For example, LaAlSiOx is formed by LaAlOx reacting with the silicon oxide films.

Figure 3E:
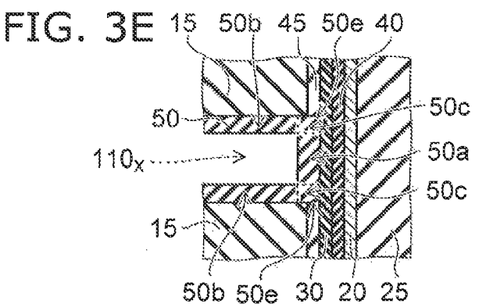

As shown in FIG. 3E, for example, the second insulating film 50 that has a thickness of about 15 nm is formed on the inner surface of the space 110x. The second insulating film 50 includes, for example, LaAlSiOx. As recited above, the second insulating film that is formed by modifying the metal oxide film 150 includes the first portion 50a, the second portion 50b, and the third portion 50c.

The first portion 50a is the portion where the third insulating film 45 and the metal oxide film 150 react; and the first portion 50a contacts, for example, the charge storage layer 30. The second portion 50b is the portion where the inter-layer insulating film 15 and the metal oxide film 150 react.

The third portion 50c is the portion that links the first portion 50a and the second portion 50b. For example, in the metal oxide film 150 prior to the heat treatment shown in FIG. 3D, the boundary between the portion contacting the inter-layer insulating film 15 and the portion contacting the third insulating film 45 is sharp. Then, in the second insulating film 50 formed by performing the heat treatment of the metal oxide film 150, the third portion 50c has a curved surface at the surface on the charge storage layer 30 side that protrudes (or expands) toward the charge storage layer 30.

Thus, the reason that the surface of the third portion 50c becomes a curved surface can be explained, for example, as follows. There is an upper limit of the amount of the silicon oxide film ($SiO_2$) that can be assimilated into the LaAlOx by reacting with the LaAlOx due to the heat treatment. Therefore, in the third portion 50c into which $SiO_2$ is assimilated from both the inter-layer insulating film 15 and the third insulating film 45, the entire third insulating film 45 cannot be assimilated; and a portion of the third insulating film 45 remains between the charge storage layer 30 and the third portion 50c. As a result, the third portion 50c for which the sharp portion of the metal oxide film 150 is rounded is formed.

Also, as shown in FIG. 3E, in the case where the third insulating film 45 and the metal oxide film 150 are caused to react so that the first portion 50a contacts the charge storage layer 30, the curvature radius of the third portion 50c on the charge storage layer 30 side is greater than the film thickness of the third insulating film 45.

The $SiO_2$ that reacts with the LaAlOx is dependent on the film thickness of the LaAlOx, the proportion of La and Al, and the temperature and time of the heat treatment. Accordingly, by appropriately adjusting these factors, the amount of the $SiO_2$ reacting with the LaAlOx can be controlled. Thereby, the second insulating film 50 can be formed to have optimal characteristics as a blocking insulating film. For example, the leakage properties of the blocking insulating film can be improved by controlling the curvature of the surface.

It is possible to make the proportion of silicon included in the first portion 50a that is different from the proportion of silicon included in the second portion 50b. Thereby, it is also possible to optimize the first portion 50a that acts as the blocking insulating film and the second portion 50b that acts as a portion of the inter-layer insulating film.

Also, the Si proportion of the LaAlSiOx in the portion of the second portion 50b contacting the inter-layer insulating film 15 can be made to be larger than the Si proportion of the LaAlSiOx in the portion of the second portion 50b contacting the control gate 10.

Figure 3F:
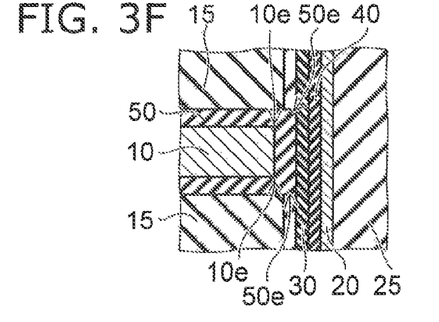

As shown in FIG. 3F, the space 110x is filled by forming, for example, a metal layer on the second insulating film 50. Thereby, the control gate 10 can be formed. For example, tungsten nitride (WN) having a thickness of about 5 nm is deposited on the second insulating film 50 using low pressure CVD. The source gas includes, for example, $WF_6$ and $NH_3$. Further, the space 110x is filled by depositing tungsten (W) on the WN film using low pressure CVD. Thus, the memory cell MC1 can be formed along the memory hole 17.

Although TEOS is used as the material of the inter-layer insulating film 15 in the manufacturing processes recited above, other gases may be used. For example, the deposition may be performed using PCVD (Plasma-enhanced CVD) using monosilane ($SIH_4$) and nitrous oxide ($N_2O$) as source materials.

Although an example is illustrated in which CVD using $SiH_2Cl_2$ and $NH_3$ as source materials is used in the formation process of the sacrificial film 110, other methods and gases may be used. For example, PCVD using $SiH_4$ and $NH_3$ as source materials may be used.

Although an example is illustrated in which TDMAS and $O_3$ are used in the formation of the first insulating film 40, the third insulating film 45, and the core 25, other methods and gases may be used. For example, CVD using $SiH_2Cl_2$ and $N_2O$ as source materials may be used.

Although ALD is illustrated as the method for forming the charge storage layer 30, other methods may be used. For example, CVD using HCD (hexachiorodisilane) and $NH_3$ as source materials may be used.

Although CVD using monosilane as a source material is used in the formation of the channel body 20, other source gases may be used. For example, $Si_2H_6$ may be used.

Although ALD using $(C_3H_7C_5H_4)_3La$ as the La source material, TMA (tetramethylaluminum) as the Al source material, and $O_3$ as the oxidizing agent is illustrated in the formation of the metal oxide film 150 (LaAlOx), other methods and gases may be used. For example, $H_2O$ may be used instead of the oxidizing agent $O_3$. Also, other oxidizing agents may be used. Also, AlOx may be deposited after forming the LaOx. A stacked film in which LaOx and AlOx are formed alternately may be used.

For forming the surface rounding in the third portion 50c of the second insulating film 50, materials other than those recited above can be used. For example, other metal oxide films that react with $SiO_2$ can be used. For example, HfOx also reacts with $SiO_2$, forming HfSiOx. Accordingly, similarly to LaAlOx, the surface of the third portion 50c can be rounded.

Further, an additive for suppressing and promoting the reaction with $SiO_2$ may be used. For example, because the reactivity with $SiO_2$ is poorer for Hf than for La, it is possible to control the reaction with $SiO_2$ by adding Hf to the LaAlOx.

Although processing in a nitrogen atmosphere is illustrated as the modification anneal, other gas atmospheres may be used. For example, an oxidation atmosphere such as $H_2O$, NO, $O_2$, etc., or a nitriding atmosphere such as $NH_3$, etc., may be used. Also, because the reaction between LaAlOx and $SiO_2$ is dependent on the atmosphere in the modification anneal, the proportion of La, Al, and Si can be controlled by selecting the gas types. For example, by appropriately selecting the gas types, the leakage current of the blocking insulating film can be reduced. For example, the modification anneal is performed at 800 to 1000° C. in a nitrogen atmosphere.

Although an example is illustrated in the embodiment recited above in which the WN film is interposed between the tungsten electrode and the second insulating film 50, other materials may be used. For example, TiN may be formed using $TiCl_4$ and $NH_3$ as source gases.

Although tungsten (W) is used as the electrode material, polysilicon to which an impurity having a high concentration is added may be used. Also, siliciding may be performed by causing Ni, etc., to react with polysilicon.

Although an example is illustrated in which a silicon nitride film is used as the sacrificial film 110, for example, other materials that have large wet etching selectivity with the inter-layer insulating film 15 may be used. Such materials include, for example, polysilicon.

For example, about 50 nm of polysilicon is deposited using CVD using monosilane as a source gas at a growth temperature of 400 to 800° C. in a reduced-pressure atmosphere of not more than 2000 Pa. For example, the polysilicon can be removed by an alkaline chemical liquid while ensuring selectivity with the silicon oxide film.

Although $SiO_2$ is illustrated as the material of the third insulating film 45, materials other than $SiO_2$ may be used as long as the materials thermally react with the metal oxide films of LaAlOx, etc. For example, polysilicon or SiNx having a large proportion of silicon may be used.

FIGS. 4A to 4D are schematic views showing the method for manufacturing the memory cell according to a modification of the first embodiment.

Figure 4A:
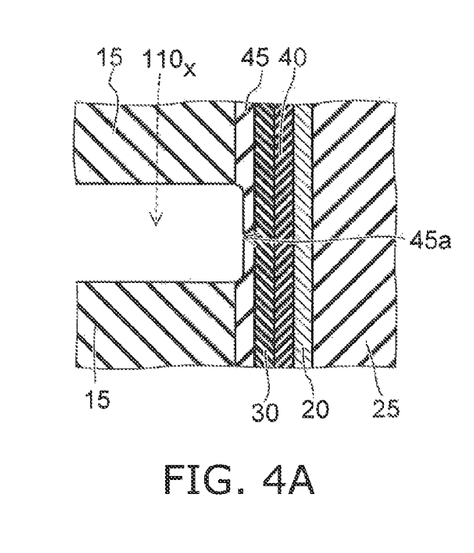

For example, in the process shown in FIG. 3C, after removing the sacrificial film 110 and prior to forming the metal oxide film 150, a portion of the third insulating film 45 may be removed by etching. If both the inter-layer insulating film 15 and the third insulating film 45 are silicon oxide films, the inter-layer insulating film 15 also is etched with the third insulating film 45. As a result, as shown in FIG. 4A, the surface of the third insulating film 45 exposed in the space 110x is formed to have a concave surface having a curvature at two ends of the surface.

Figure 4B:
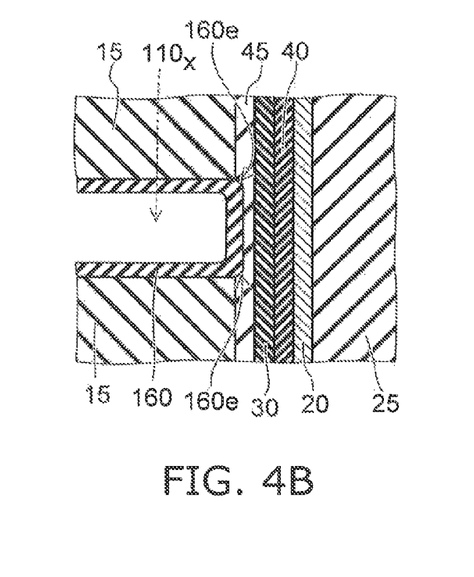

As shown in FIG. 4B, a metal oxide film 160 is formed on the inter-layer insulating film 15 and the third insulating film 45 in the interior of the space 110x. The metal oxide film 160 is, for example, LaAlSiOx.

For example, the metal oxide film 160 is formed using ALD at a deposition temperature of 100 to 500° C. in a reduced-pressure atmosphere of not more than 2000 Pa. $(C_3H_7 C_5H_4)_3La$ is used as the La source material; TMA (tetramethylaluminum) is used as the Al source material; and TDMS is used as the Si source material. Also, the Si source material may include a gas other than TDMS, e.g., $Si_2H_6$ can be used. For example, the metal oxide film 160 is deposited to have a thickness of about 7 nm.

Figure 4C:
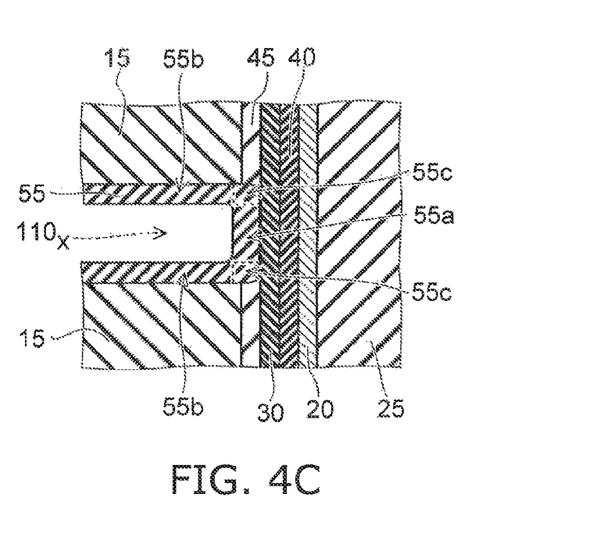

Then, the metal oxide film 160 is modified by performing heat treatment of the metal oxide film 160. For example, heat treatment at 950° C. is performed in a nitrogen atmosphere. Thereby, as shown in FIG. 4C, a second insulating film 55 can be formed. The second insulating film 55 includes a first portion 55a, a second portion 55b, and a third portion 55c. The first portion 55a contacts the charge storage layer 30. The second portion 55b contacts the inter-layer insulating film 15. The third portion 55c links the first portion 55a and the second portion 55b.

The second insulating film 55 is, for example, LaAlSiOx having a thickness of about 15 nm. The second insulating film 55 reacts with the $SiO_2$ of the inter-layer insulating film 15 and the third insulating film 45 and includes more Si than the metal oxide film 160.

Figure 4D:
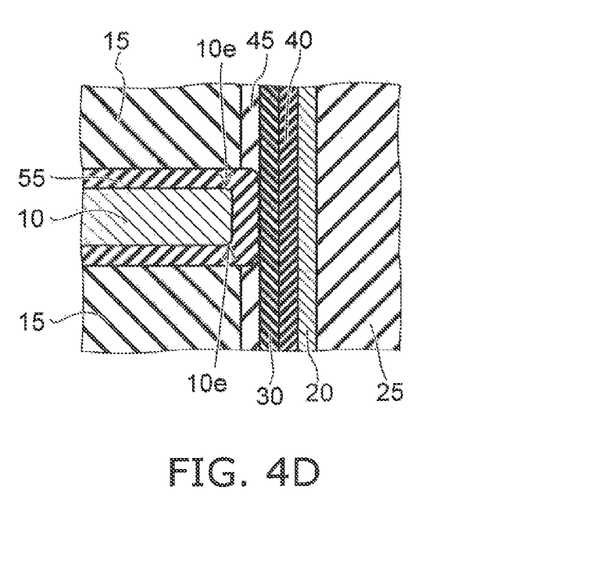

As shown in FIG. 4D, the space 110x is filled by forming, for example, a metal layer on the second insulating film 55. Thereby, the control gate 10 can be formed. For example, tungsten nitride (WN) is deposited on the second insulating film 50 using low pressure CVD. Further, the space 110x is filled by depositing tungsten (W) on the WN film using low pressure CVD.

In the example, by adding Si to LaAlOx as the metal oxide film 160, the controllability of the proportion of La, Al, and Si inside the LaAlSiOx can be improved. In other words, in the case where the LaAlSiOx is modified by causing the LaAlOx to react with $SiO_2$, the proportion of Si included in the LaAlSiOx is dependent on the film thickness of the $SiO_2$. In the embodiment, by depositing LaAlSiOx that pre-contains Si, the second insulating film 55 that has an optimal composition ratio of La, Al, and Si can be realized without affecting the film thickness of the $SiO_2$.

For example, it is favorable to reduce the thickness of the third insulating film 45 to control the Si proportion of the first portion 55a of the second insulating film 55. In such a case, because the third insulating film 45 that reacts in the modification anneal becomes thin, a disadvantage occurs that the curvature radius of the third portion 55c becomes small. In the embodiment, a recess that has a curvature is made at two ends by etching a portion of the third insulating film 45 after the removal of the sacrificial film 110. Thereby, the two ends of the portion of the metal oxide film 160 contacting the third insulating film 45 can have curvatures. In other words, the two ends of the portion of the metal oxide film 160 contacting the third insulating film 45 are pre-formed to be rounded. Thereby, the surface of the third portion 55c on the charge storage layer 30 side can have the same curvature radius as the third portion 50c of the second insulating film 50 shown in FIG. 3E. At this time, in the third portion 55c, the curvature radius on the side contacting the control gate 10 is larger than the curvature radius on the control gate side of the third portion 50c. In other words, the edge of the control gate 10 contacting the third portion 55c can have a curvature. Thereby, the electric field concentration at the end portions of the control gate 10 can be relaxed. As a result, it is possible to reduce the leakage current of the blocking insulating film in the programming and erasing of the data; and the characteristics of the memory cell improve.

Also, the third insulating film 45 is formed as a protective film of the charge storage layer 30 when removing the sacrificial film 110. In the case where the third insulating film 45 is caused to remain as a portion of the memory cell structure, there is a risk of an increase of the leakage current caused by a high electric field applied to the third insulating film in the programming of the data. Also, there is a risk that the increase of the capacitance of the blocking insulating film due to the third insulating film 45 being included may cause an increase of the programming/erasing voltage. Conversely, in the case where the third insulating film 45 is removed by, for example, wet etching, etc., the charge storage layer 30 and the inter-layer insulating film 15 may be damaged.

In the embodiment, the metal oxide film 150 or 160 and the third insulating film 45 are mixed by heat treatment. Thereby, a memory cell structure that does not include the third insulating film 45 can be realized without damaging the charge storage layer 30 and the inter-layer insulating film 15. Thereby, the leakage current in the programming is suppressed; and it is possible to improve the programming characteristics. Also, the capacitance of the memory cell can be reduced by mixing the third insulating film 45 with the metal oxide film 150 or 160. Thereby, the operating voltage in the programming and the erasing is reduced; and the characteristics of the memory cell can be improved.

On the other hand, in the case where the third insulating film 45 is not formed, the charge storage layer 30 is exposed after removing the sacrificial film 110. The source gas when forming the metal oxide film 150 or 160 includes an oxidizing agent. Therefore, there is a risk that the charge storage layer 30 that is exposed in the space where the sacrificial film 110 is removed may oxidize. For example, there are cases where the charge storage layer 30 is damaged by the wet processing when etching the sacrificial film 110; and the surface of the charge storage layer 30 is in a state of being easily oxidized. Therefore, the charge storage layer 30 may include an interface layer which is the oxidized surface of the charge storage layer 30. The interface layer has a low dielectric constant and lowers the energy barrier between the blocking insulating film and the charge storage layer. It also increases the leakage current of the blocking insulating film in the programming and causes degradation of the programming characteristics. Also, the interface layer increases the capacitance of the memory cell and increases the operating voltage in the programming/erasing. To suppress such characteristic degradation of the memory cell, it is desirable to employ a method for manufacturing the memory cell in which the interface layer is not formed. In the embodiment, a memory cell structure in which the interface layer is not formed can be realized by mixing the third insulating film 45 and the metal oxide film 150 or 160. Also, by using the structure in which the blocking insulating film directly contacts the charge storage layer, the leakage current in the programming is suppressed; and the programming characteristics are improved. Also, by reducing the memory cell capacitance by eliminating the capacitance of the interface layer, the voltage in operations such as programming, erasing, etc., can be suppressed.

Second Embodiment

Figure 5:
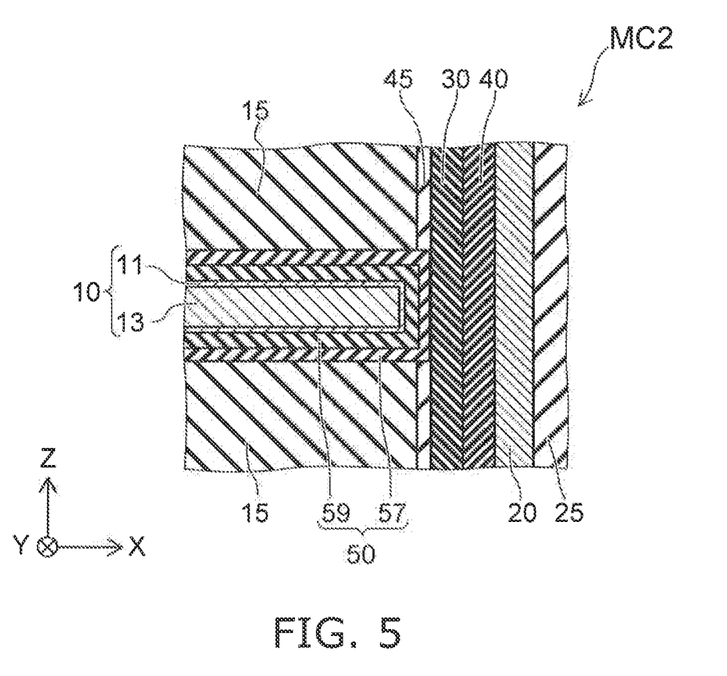
FIG. 5 is an exemplary cross-sectional view schematically showing a memory cell of a non-volatile memory device according to a second embodiment.

FIG. 5 is a schematic cross-sectional view showing a memory cell MC2 of a non-volatile memory device according to a second embodiment. As shown in FIG. 5, the memory cell MC2 is provided between the control gate 10 and the channel body 20.

The memory cell MC2 includes the charge storage layer 30, the first insulating film 40, and the second insulating film 50. The charge storage layer 30 is provided between the control gate 10 and the channel body 20. The first insulating film 40 is provided between the channel body 20 and the charge storage layer 30, and acts as a tunneling insulating film. The second insulating film 50 is provided between the control gate 10 and the charge storage layer 30, and acts as a blocking insulating film.

The second insulating film 50 includes a stacked structure including a first film 57 and a second film 59. The first film 57 is provided between the charge storage layer 30 and the second film 59. The second film 59 is provided between the control gate 10 and the first film 57.

The second insulating film 50 also extends between the control gate 10 and the inter-layer insulating film 15. The first film 57 also is provided between the inter-layer insulating film 15 and the second film 59. The second film 59 also is provided between the control gate 10 and the first film 57.

The second film 59 is, for example, a lanthanoid metal oxide film having a dielectric constant that is higher than those of the inter-layer insulating film 15 and the first insulating film 40. The second film 59 may include, for example, LaOx. In contrast, the first film 57 is, for example, a non-lanthanoid metal oxide film. The first film 57 may include, for example, aluminum oxide ($Al_2O_3$).

To improve the characteristics, such as the erasing characteristics, of the memory cell MC2, it is desirable to reduce the electrons that pass through the second insulating film 50 and are re-injected into the charge storage layer 30 in the erasing. In other words, it is favorable to reduce the leakage current of the second insulating film 50 due to the high electric field. Also, to suppress the leakage current of the second insulating film 50, it is effective to dispose a high dielectric constant film in the portion contacting the control gate 10 on the side where the electrons are injected. Thereby, the energy barrier for the electrons under the high electric field is increased; and the current flowing due to FN tunneling (Fowler-Nordheim tunneling) can be suppressed.

For example, lanthanum oxide (LaOx) is a material that has a high dielectric constant and may increase the energy barrier for the electrons, and thus, is a material that is advantageous for reducing the high electric field leakage. The relative dielectric constant of LaOx is, for example, 30; and it is possible to set the electron barrier to 2.3 eV.

However, LaOx has a property of assimilating and mixing with $SiO_2$ when heat treatment is applied in the state of being in contact with $SiO_2$. Such mixing may be nonuniform and have fluctuation. The dielectric constant of LaSiOx formed by mixing LaOx and $SiO_2$ is lower than that of LaOx. Also, the dielectric constant of LaSiOx is dependent on the content ratio of Si. Accordingly, the nonuniform mixing of LaOx and $SiO_2$ causes the fluctuation of the dielectric constant to occur.

For example, in the case where the inter-layer insulating film 15 includes $SiO_2$ and the blocking insulating film includes LaOx, there is a possibility that the two may mix due to the heat treatment of the manufacturing processes. The fluctuation of the dielectric constant of the blocking insulating film provided between the control gate 10 and the inter-layer insulating film 15 causes fluctuation of the electrical distance to the adjacent control gate and causes the electric field distribution to be nonuniform. For example, there is a possibility that local electric field concentration may occur at the portion where the electrical distance is shorter due to the decrease of the dielectric constant. Thereby, a breakdown voltage may decrease between the control gates 10, making the manufacturing yield decrease.

Such mixing with $SiO_2$ also occurs for other lanthanoid metal oxides. Lanthanoid metal oxides other than LaOx include, for example, cerium oxide (CeOx), praseodymium oxide (PrOx), neodymium oxide (NdOx), praseodymium oxide (PmOx), samarium oxide (SmOx), europium oxide (EuOx), gadolinium oxide (GdOx), terbium oxide (TbOx), dysprosium oxide (DyOx), holmium oxide (HoOx), erbium oxide (ErOx), thulium oxide (TmOx), ytterbium oxide (YbOx), and lutetium oxide (LuOx).

Further, mixing with $SiO_2$ occurs similarly for metal oxide films including other elements with a lanthanoid element. Such a metal oxide film can include, for example, LaSiOx, LaAlOx, LaAlSiOx, LaHfOx, LaZrOx, etc. Also, there is a possibility that mixing with $SiO_2$ may occur similarly for an oxynitride film containing these compounds and nitrogen, etc., or a nitride of these metals.

In the embodiment, the second insulating film 50 is formed between the control gate 10 and the inter-layer insulating film 15. The second insulating film 50 includes the first film 57 and the second film 59. The first film 57 that contacts the inter-layer insulating film 15 is a non-lanthanoid metal oxide film. The second film 59 that contacts the control gate 10 is, for example, a lanthanoid metal oxide film having a high electron barrier and a dielectric constant that is higher than that of a non-lanthanoid metal oxide. Thereby, the back-tunneling of the electrons into the memory cell MC2 in the erasing operation is suppressed; and the erasing characteristics can be improved. Also, the mixing of $SiO_2$ and the blocking insulating film can be suppressed by the first film 57 including the non-lanthanoid metal oxide film.

For example, aluminum oxide ($Al_2O_3$), magnesium oxide (MgO) that has a relative dielectric constant of about 10, yttrium oxide ($Y_2O_3$) that has a relative dielectric constant of about 16, hafnium oxide ($HfO_2$) that has a relative dielectric constant of about 22, zirconium oxide ($ZrO_2$), etc., can be used as the non-lanthanoid metal oxide. Also, the non-lanthanoid metal oxide may be an insulating film made of a three-element metal compound such as hafnium silicate (HfSiO) or hafnium aluminate (HfAlO).

Also, other than the non-lanthanoid metal compound, for example, an oxynitride and/or a nitride that has a relative dielectric constant greater than 7 can be used as the first film 57. In other words, an oxide or an oxynitride including at least one element of silicon (Si), aluminum (Al), magnesium (Mg), yttrium (Y), hafnium (Hf), or zirconium (Zr) may be used.

Also, the first film 57 may include a stack with a silicon oxide including the elements recited above, a silicon oxynitride film or a silicon nitride film, or a stacked structure of the silicon oxynitride film or the silicon nitride film.

A method for manufacturing the memory cell MC2 of the non-volatile memory device according to the embodiment will now be described using FIGS. 6A to 6D. FIGS. 6A to 6D are schematic cross-sectional views showing the manufacturing processes of the non-volatile memory device according to the second embodiment.

Figure 6A:
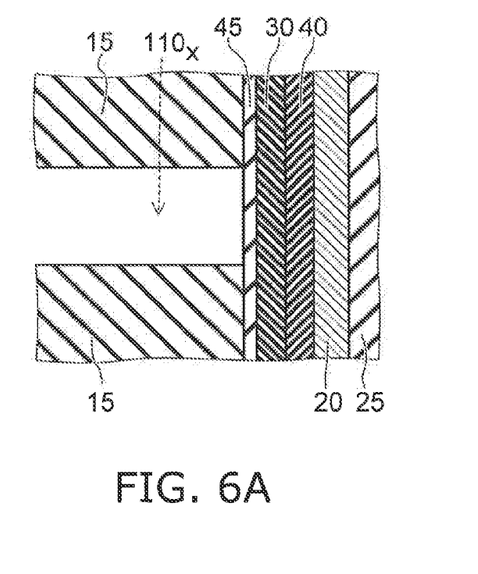

FIG. 6A shows the cross section of the stacked body 100 in which the sacrificial film 110 is removed (referring to FIGS. 3A and 3C). The inter-layer insulating film 15 and the third insulating film 45 are exposed in the space 110x where the sacrificial film 110 is removed.

In the embodiment, the inter-layer insulating film 15, the channel body 20, the charge storage layer 30, the first insulating film 40, the third insulating film 45, and the core 25 are formed using physical vapor deposition (PVD), chemical vapor deposition (CVD), or atomic layer deposition (ALD).

The inter-layer insulating film 15 is, for example, a silicon oxide film having a thickness of 10 to 50 nm. The channel body 20 is, for example, a silicon film of 1 to 20 nm. The charge storage layer 30 is, for example, a silicon nitride film of 1 to 20 nm. The first insulating film 40 is, for example, a silicon oxide film having a thickness of 1 to 20 nm. The third insulating film 45 is, for example, a silicon oxide film having a thickness of 1 to 20 nm. The sacrificial film 110 that is removed is, for example, a silicon nitride film having a thickness of 10 to 50 nm.

Figure 6B:
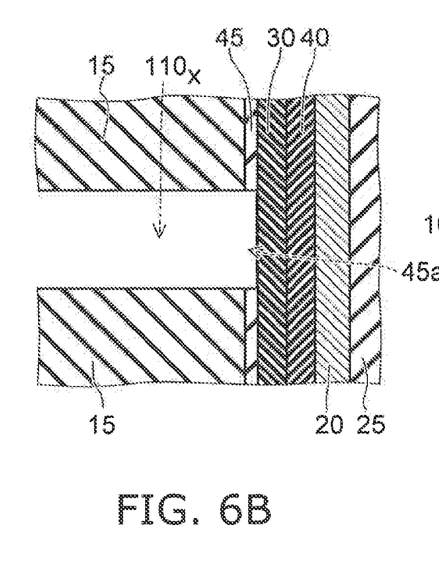

As shown in FIG. 6B, the charge storage layer 30 is exposed by removing a portion 45a of the third insulating film 45 exposed in the space 110x.

Figure 6C:
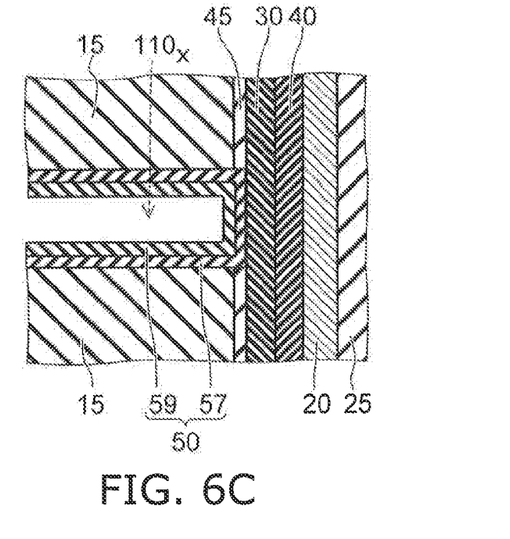

As shown in FIG. 6C, the first film 57 is formed on the inter-layer insulating film 15 and the charge storage layer 30 inside the space 110x. In the example, the first film 57 has a structure in which two films are stacked. The first film 57 includes, for example, a silicon oxide film that has a thickness of 1 to 10 nm and is formed on the inter-layer insulating film 15 and the charge storage layer 30, and an aluminum oxide of 1 to 10 nm that is formed on the silicon oxide film.

Then, the second film 59 is formed on the first film 57. The second film 59 is a lanthanoid metal oxide film.

The first film 57 and the second film 59 are formed using chemical vapor deposition (CVD) or atomic layer deposition (ALD). Specifically, for example, the silicon oxide film is formed using ALD using tris(dimethylamino)silane (TD-MAS) as a silicon source material. For example, the aluminum oxide film is formed using ALD using tri-methyl aluminum (TMA) as an aluminum source material. For example, the lanthanum oxide film is formed using ALD using lanthanum isopropyl cyclopentadienyl (La(iPrCp)$_3$) as a lanthanum source material and ozone as an oxidizing agent. Each film is formed at the temperature of, for example, 100° C. to 600° C.

For example, ALD forms a film by atomic layer units and by multiply repeating a sequence of supplying an active gas such as ozone, etc., purging by vacuum evacuation, supplying a metal source gas such as TMA, etc., purging by vacuum evacuation, and again supplying an active gas such as ozone, etc. The organic source material that is used as the metal source material may be another alkylaluminium in which an alkyl group other than a methyl group is bonded to, for example, an aluminum element, an amino source material in which an amino group is bonded to an aluminum element, or a material such as aluminum halide, etc. The oxidizing agent may be another material such as water, oxygen, an oxygen radical, etc.

Figure 6D:
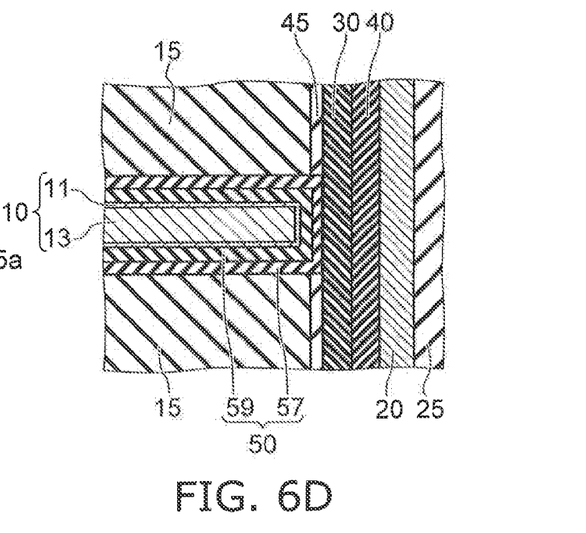

As shown in FIG. 6D, for example, a metal layer is formed on the second insulating film 50, filling the space 110x. Thereby, the control gate 10 can be formed. The control gate 10 has, for example, a stacked structure including two metal layers. For example, a tungsten nitride (WN) layer is formed as a first layer 11. Further, the space 110x is filled by depositing tungsten (W) as a second layer 13 on the WN layer. For example, the first layer acts as a barrier layer that suppresses the diffusion or migration of the metallic elements included in the second layer.

Figure 7A:
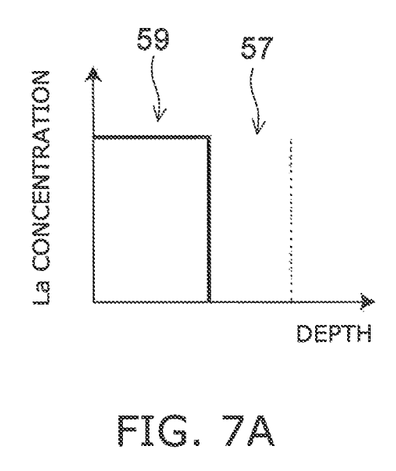
FIGS. 7A and 7B are exemplary views schematically showing characteristics of non-volatile memory devices according to the second embodiment.
Figure 7B:
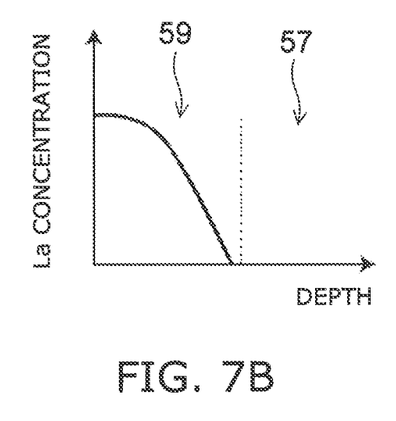

FIGS. 7A and 7B are schematic views showing characteristics of the memory cell MC2 according to the second embodiment. FIGS. 7A and 7B are schematic views showing the distribution of the lanthanum La inside the second insulating film 50. For example, as shown in FIG. 7A, the concentration of La inside LaOx may be constant in the depth direction. Also, as shown in FIG. 7B, the distribution may be a distribution in which the concentration decreases in the depth direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device, comprising:
   electrodes arranged in a first direction;
   an inter-layer insulating film between the electrodes;
   at least one semiconductor layer extending in the first direction through the electrodes and the inter-layer insulating film;
   a charge storage layer between the semiconductor layer and each of the electrodes;
   a first insulating film between the charge storage layer and the semiconductor layer; and
   a second insulating film including a first portion, a second portion, and a third portion, the first portion being provided between the charge storage layer and each of the electrodes, the second portion being provided between each of the electrodes and the inter-layer insulating film, the third portion linking the first portion and the second portion and having a curved surface on the charge storage layer side,
   the curved surface on the charge storage layer side having a curvature radius larger than a curvature radius of a surface on the electrodes side in a cross-section of the third portion parallel to the first direction and a second direction toward each of the electrodes from the charge storage layer.

2. The non-volatile memory device according to claim 1, wherein the second insulating film includes a metal oxide film containing silicon.

3. The non-volatile memory device according to claim 1, wherein the second insulating film includes LaAlSiOx.

4. The non-volatile memory device according to claim 1, wherein the second portion of the second insulating film has a first part contacting the inter-layer insulating film and a second part contacting each of the electrodes, and the first part has a silicon content greater than a silicon content of the second part.

5. The non-volatile memory device according to claim 4, wherein the second insulating film includes LaAlSiOx in the first part of the second portion.

6. The non-volatile memory device according to claim 1, wherein the first portion of the second insulating film is in contact with the charge storage layer.

7. The non-volatile memory device according to claim 1, wherein each of the electrodes has a curved surface that is in contact with the third portion of the second insulating film.

8. The non-volatile memory device according to claim 1, further comprising a third insulating film between the inter-layer insulating film and the charge storage layer.

9. A non-volatile memory device, comprising:
electrodes arranged in a first direction;
an inter-layer insulating film between the electrodes;
at least one semiconductor layer extending in the first direction through the electrodes and the inter-layer insulating film;
a charge storage layer between the semiconductor layer and each of the electrodes;
a first insulating film between the charge storage layer and the semiconductor layer; and
a second insulating film including a first portion and a second portion, the first portion being provided between the charge storage layer and each of the electrodes, the second portion being provided between each of the electrodes and the inter-layer insulating film,
a composition ratio of elements contained in the second portion being different from a composition ratio of elements contained in the first portion.

10. The non-volatile memory device according to claim 9, wherein
the second insulating film includes a metal oxide film containing silicon; and
the first portion is different in a silicon content ratio from the second portion.

11. The non-volatile memory device according to claim 10, wherein the second insulating film includes LaAlSiOx.

12. A non-volatile memory device, comprising:
electrodes arranged in a first direction;
an inter-layer insulating film between the electrodes;
at least one semiconductor layer extending in the first direction through the electrodes and the inter-layer insulating film,
a charge storage layer between the semiconductor layer and each of the electrodes;
a first insulating film between the charge storage layer and the semiconductor layer;
a second insulating film including a first portion, a second portion, and a third portion, the first portion being provided between the charge storage layer and each of the electrodes, the second portion being provided between each of the electrodes and the inter-layer insulating film, the third portion linking the first portion; and
a third insulating film between the inter-layer insulating film and the charge storage layer, the third insulating film having a part extending between the third portion and the charge storage layer.

* * * * *